United States Patent
Bright et al.

(10) Patent No.: US 6,617,886 B2
(45) Date of Patent: Sep. 9, 2003

(54) DIFFERENTIAL PAIR WITH HIGH OUTPUT SIGNAL CROSSOVER

(75) Inventors: William J. Bright, Dallas, TX (US); Ranjit Gharpurey, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/183,255

(22) Filed: Jun. 26, 2002

(65) Prior Publication Data

US 2003/0016061 A1 Jan. 23, 2003

Related U.S. Application Data

(60) Provisional application No. 60/307,400, filed on Jul. 23, 2001.

(51) Int. Cl.[7] .............................................. H03K 5/153
(52) U.S. Cl. .......................................... 327/65; 327/77
(58) Field of Search ............................. 327/63, 65, 66, 327/67, 77, 89, 52; 330/252, 253, 258

(56) References Cited

U.S. PATENT DOCUMENTS

| | | | | |
|---|---|---|---|---|
| 3,938,055 A | * | 2/1976 | Buhler | 330/258 |
| 5,239,210 A | * | 8/1993 | Scott | 327/63 |
| 5,475,323 A | * | 12/1995 | Harris et al. | 327/67 |
| 5,933,056 A | * | 8/1999 | Rothenberg | 330/258 |

* cited by examiner

Primary Examiner—Toan Tran
(74) Attorney, Agent, or Firm—W. Daniel Swayze, Jr.; W. James Brady; Frederick J. Telecky, Jr.

(57) ABSTRACT

A buffer circuit includes a differential pair output switch having an additional NPN device and resistor operational to increase the common mode output voltage of the buffer during a switching event, such that the voltage movement at the common emitter node of the differential pair output switch for the buffer circuit is decreased to substantially reduce distortion of an output signal associated with a DAC that employs the buffer circuit.

9 Claims, 2 Drawing Sheets

DIFFERENTIAL PAIR WITH HIGH OUTPUT SIGNAL CROSSOVER

This application claims priority under 35 USC §119(e)(1) of provisional application Serial No. 60/307,400, filed Jul. 23, 2001.

BACKGROUND OF THE INVENTION

1. Field of the Invention

This invention relates generally to data converters, and more particularly to a buffer circuit to control the differential pair output switch of a current steering digital-to-analog converter (DAC).

2. Description of the Prior Art

Implementing a current steering digital-to-analog converter with BiCMOS technology allows use of NPN bipolar junction transistors. NPN devices are very desirable in the design of output switches that direct current to either the true or complement output. Output switches are generally configured as differential pair circuits, one for each controlled current in the DAC.

A differential pair output switch 10 with current source 12 is illustrated in FIG. 1. The output switch 10 requires a differential voltage between the bases of the differential pair transistors 14, 16 in order to completely switch the current to either the true or complement output of the DAC. It is necessary for this current to completely switch to only one output of the DAC at a time.

FIG. 2 is a simplified schematic diagram illustrating a well known buffer circuit 20 typically used in the art to control the output switch differential pair 14, 16. It can be seen that the prior art buffer circuit 20 includes a differential pair common emitter amplifier circuit with a resistive load 22, 24. Buffer circuit 20 functions by creating a differential output voltage from a differential input voltage.

The output voltage of the differential pair 14, 16 as a function of input voltage is also well known and is illustrated in FIG. 3. With reference now to FIG. 3, it can be seen that the emitter coupled pair 14, 16 creates a differential output voltage of zero for a differential input voltage of zero. Further, it can be seen that the common mode output voltage 30 of the buffer 20 is constant and equal to one-half the single-sided output swing of the differential pair 14, 16.

Looking again at FIG. 2, the common emitter node 22 of the differential output switch 10 acts as a rectifier and "follows" the higher output of the differential buffer 20. This rectifier action results in the common emitter node 22 of the output switch 10 moving by one-half the single-sided output swing of the buffer 20. This voltage change on the common emitter node 22 during a switching event will lead to a transient error current $$I_c = C dv/dt,$$

where C is the capacitance on the common emitter node 22. This error current will ultimately result in distortion of the output signal of the digital-to-analog converter.

In view of the foregoing, there is a need for a system and method for reducing the error current at the common emitter node of the output switches associated with a current steering digital-to-analog converter (DAC).

SUMMARY OF THE INVENTION

The present invention provides a circuit and method for reducing the error current at the common emitter node of the output switches associated with a current steering digital-to-analog converter (DAC).

In one aspect of the invention, a circuit is provided that controls the differential pair output switch of a current steering DAC.

In another aspect of the invention, a circuit is provided that acts to reduce the movement of the common emitter node of the output switch during a switching event in a current steering DAC.

In still another aspect of the invention, a circuit is provided that acts to increase the common mode level as the magnitude of the differential mode level decreases for a differential pair output switch of a current steering DAC. This increase in common mode voltage of the output for a decrease in the magnitude of the differential output results in less movement at the common emitter node of the output switch differential pair during a switching event.

According to one embodiment of the present invention, a buffer circuit functions as a differential pair having a high output signal crossover. The buffer circuit includes a traditional common emitter differential pair having a resistive load, but also includes an additional NPN device and resistor. The base node of the NPN device is connected to the highest input voltage level to the buffer circuit, i.e. the positive supply if it is shared. The additional NPN device and resistor act to divert an increasing amount of current away from either differential pair load resistor as the magnitude of the differential pair input to the buffer approaches zero. As the magnitude of the differential input increases, the common mode level will decrease back to one-half the single sided output swing. The common mode output voltage therefore does not remain constant during a switching event.

BRIEF DESCRIPTION OF THE DRAWINGS

Other aspects and features of the present invention, and many of the attendant advantages of the present invention, will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
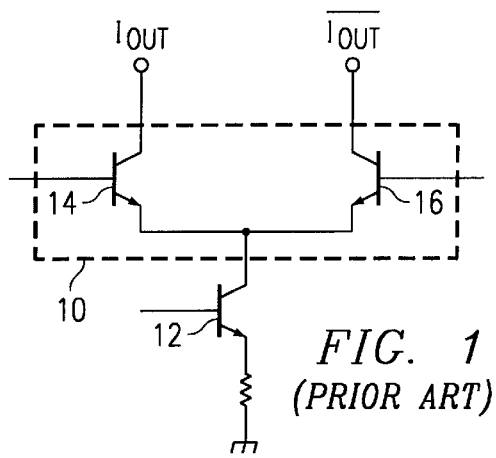
FIG. 1 is a schematic diagram illustrating an output switch differential pair with current source associated with a current steering digital-to-analog converter and that is known in the art.
Figure 2:
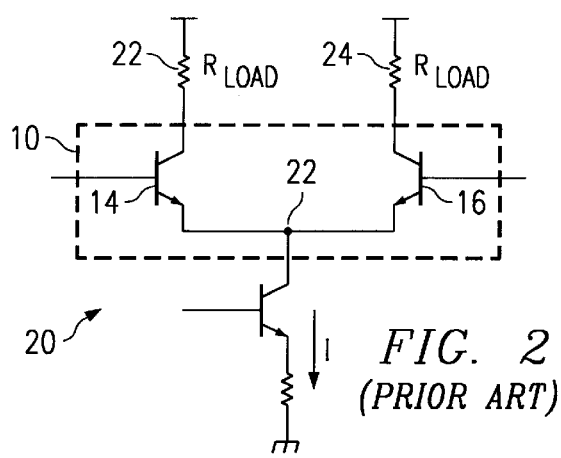
FIG. 2 is a schematic diagram illustrating the output switch differential pair with current source shown in FIG. 1 modified to include load resistors and that is known in the art.
Figure 3:
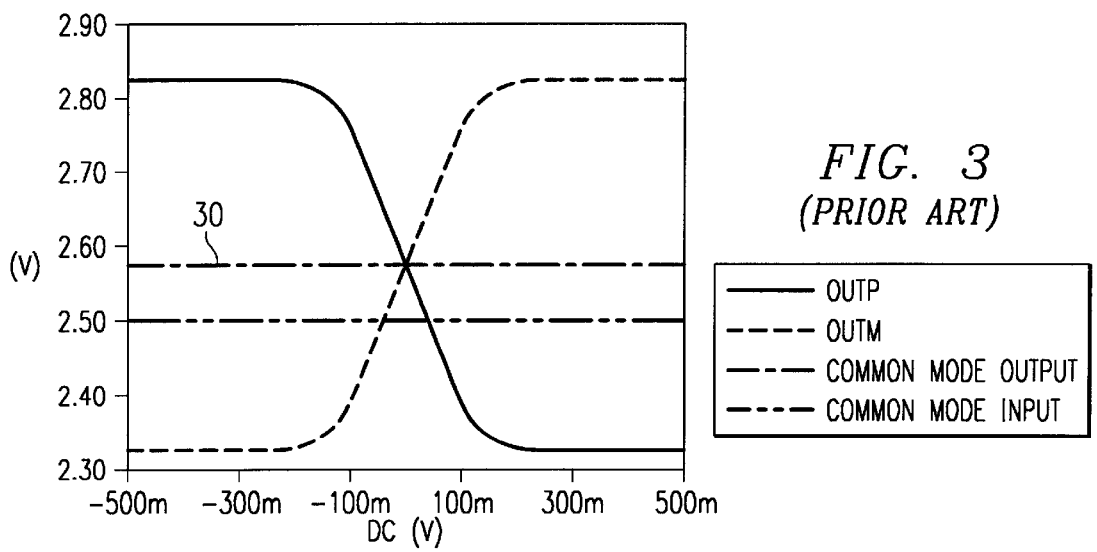
FIG. 3 is a simulation diagram illustrating the output voltage as a function of input voltage for the output switch differential pair with current source and load resistors shown in FIG. 2 and that is familiar to those skilled in the art.
Figure 4:
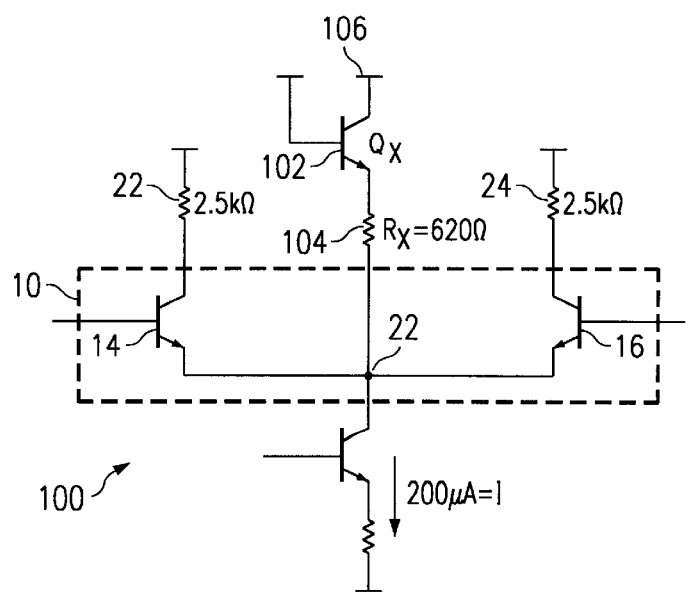
FIG. 4 is a schematic diagram illustrating a buffer circuit to control the differential pair output switch of a current steering DAC according to one embodiment of the present invention.
Figure 5:
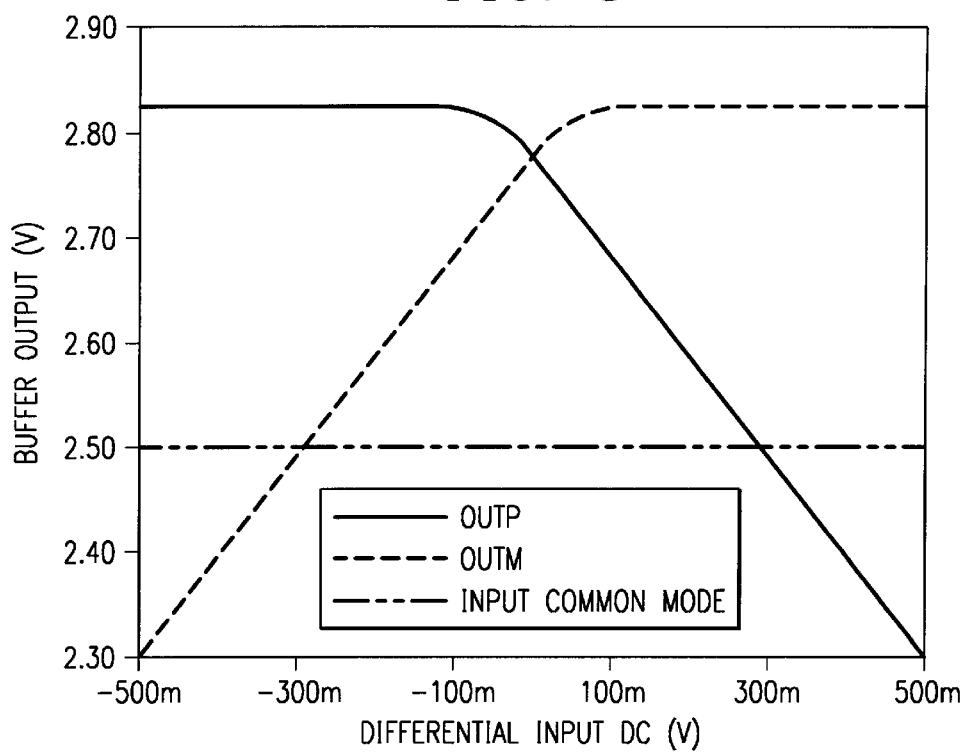
FIG. 5 is a simulation diagram illustrating the output voltage as a function of input voltage for the buffer circuit shown in FIG. 4.
Figure 6:
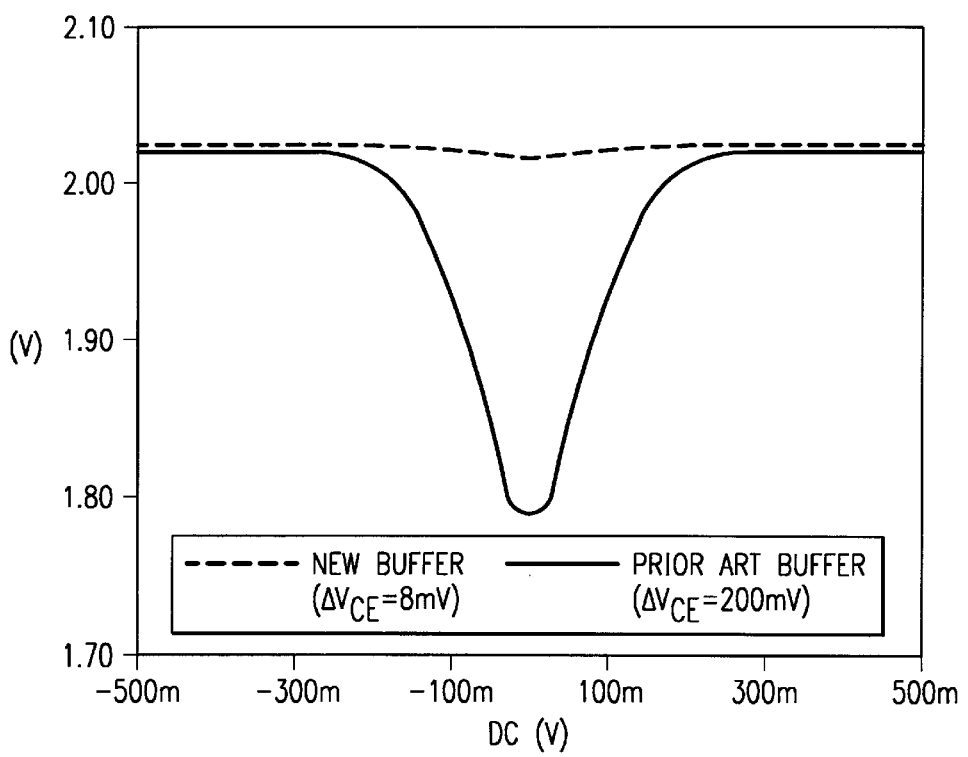
FIG. 6 is a simulation diagram illustrating the voltage movement at the common emitter node of the differential pair output switch for the buffer circuit shown in FIG. 4 during a switching event.

The present invention can best be understood by first repeating the background set forth herein before with reference to FIGS. 1–3 before setting forth the detailed description of the present embodiment of the invention with the aid of FIGS. 4–6.

Implementing a current steering digital-to-analog converter with BiCMOS technology allows use of NPN bipolar junction transistors. NPN devices are very desirable in the design of output switches that direct current to either the true or complement output. Output switches are generally configured as differential pair circuits, one for each controlled current in the DAC.

A differential pair output switch 10 with current source 12 is illustrated in FIG. 1. The output switch 10 requires a differential voltage between the bases of the differential pair transistors 14, 16 in order to completely switch the current to either the true or complement output of the DAC. It is necessary for this current to completely switch to only one output of the DAC at a time.

FIG. 2 is a simplified schematic diagram illustrating a well known buffer circuit 20 typically used in the art to control the output switch differential pair 14, 16. It can be seen that the prior art buffer circuit 20 includes a differential pair common emitter amplifier circuit with a resistive load 22, 24. Buffer circuit 20 functions by creating a differential output voltage from a differential input voltage.

The output voltage of the differential pair 14, 16 as a function of input voltage is also well known and is illustrated in FIG. 3. With reference now to FIG. 3, it can be seen that the emitter coupled pair 14, 16 creates a differential output voltage of zero for a differential input voltage of zero. Further, it can be seen that the common mode output voltage 30 of the buffer 20 is constant and equal to one-half the single-sided output swing of the differential pair 14, 16.

Looking again at FIG. 2, the common emitter node 22 of the differential output switch 10 acts as a rectifier and "follows" the higher output of the differential buffer 20. This rectifier action results in the common emitter node 22 of the output switch 10 moving by one-half the single-sided output swing of the buffer 20. This voltage change on the common emitter node 22 during a switching event will lead to a transient error current $$I_c = C\, dv/dt,$$

where C is the capacitance on the common emitter node 22. This error current will ultimately result in distortion of the output signal of the digital-to-analog converter.

In view of the foregoing, there is a need for a system and method for reducing the error current at the common emitter node of the output switches associated with a current steering digital-to-analog converter (DAC).

FIG. 4 is a schematic diagram illustrating a buffer circuit 100 to control the differential pair output switch 10 of a current steering DAC according to one embodiment of the present invention. The buffer circuit 100 acts to reduce the movement of the common emitter node 22 of the output switch 10 during a switching event. This is accomplished by having the common mode level increase as the differential mode level approaches zero. It can be seen from FIG. 4 that the buffer circuit 100 includes a traditional common emitter differential pair 14, 16 with resistor load 22, 24, but further includes an additional NPN device 102 and resistor 104. The base node of the NPN device 102 is connected to the highest input voltage level to the buffer circuit 100, i.e. the positive supply 106 if it is shared. The addition of NPN device 102 and resistor 104 acts to divert an increasing amount of current away from either load resistor 22, 24 as the magnitude of differential input voltage to the buffer circuit 100 approaches zero. As the magnitude of the differential input increases, the common mode level will decrease back to one-half the single sided output swing. The common mode output voltage therefore does not remain constant during a switching event.

FIG. 5 is a simulation diagram illustrating the output voltage as a function of input voltage for the buffer circuit 100 shown in FIG. 4. The increase in common mode voltage of the output for a decrease in the magnitude of the differential output results in less movement at the common emitter node 22 of the output switch 10 differential pair 14, 16 during a switching event. The action that results at the common emitter node 22 of the output switch 10 differential pair 14, 16 is shown in FIG. 6.

FIG. 6 is a simulation diagram illustrating the voltage movement at the common emitter node 22 of the differential pair 14, 16 output switch 10 for the buffer circuit 100 shown in FIG. 4 during a switching event. It can be seen that the voltage movement is cut to about 4% of the prior art buffer 20 depicted in FIG. 2, and therefore leads to less distortion of the output signal associated with a digital-to-analog converter.

In summary explanation, a buffer circuit includes a differential pair output switch having an additional NPN device and resistor operational to increase the common mode output voltage of the buffer during a switching event, such that the voltage movement at the common emitter node of the differential pair output switch for the buffer circuit is decreased to substantially reduce distortion of an output signal associated with a DAC that employs the buffer circuit.

In view of the above, it can be seen the present invention presents a significant advancement in the art of current steering DAC technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. The present invention can, for example, be implemented using transistor types such as MOS, HBT, PNP, as well as others. Further, the present invention can be implemented by adding a third current path at the common emitter node of the differential pair using a resistor or combination thereof without the use of additional transistor (s).

What is claimed is:

1. A buffer circuit comprising:
   a common emitter differential pair output switch having a pair of transistors configured with a common emitter node;
   a current source operational to supply current to the common emitter node in response to a differential input signal applied to the common emitter differential pair output switch; and
   a current path control circuit connected to the common emitter node and operational to increase a common mode output voltage associated with the common emitter differential pair output switch during a switching event,
   wherein the current path control circuit comprises solely one transistor type selected from the group consisting of a MOS transistor, an HBT transistor, an NPN transistor, and a PNP transistor.

2. The buffer circuit according to claim 1 further comprising at least one load resistor connected to at least one output switch transistor.

3. The buffer circuit according to claim 1 wherein the common emitter differential pair output switch, current source and current path control circuit are devoid of PNP transistors.

4. The buffer circuit according to claim 1 wherein the current path control circuit comprises an active resistor.

5. A buffer circuit comprising:
   a common emitter differential pair output switch having a pair of transistors configured with a common emitter node;
   a current source operational to supply current to the common emitter node in response to a differential input signal applied to the common emitter differential pair output switch; and
   a current oath control circuit connected to the common emitter node and operational to increase a common mode output voltage associated with the common emitter differential pair output switch during a switching event,
   wherein the current path control circuit consists of a resistor.

6. The buffer circuit according to claim 5 wherein the resistor is an active resistor.

7. A buffer circuit comprising:
   a differential pair output switch;
   a current source operational to vary a supply current applied to the differential pair output switch in response to a differential input signal applied to the differential pair output switch; and
   a control circuit operational to increase a common mode output voltage associated with the differential pair output switch in response to a decreasing differential output voltage associated with the differential pair output switch caused by the differential input signal,
   wherein the control circuit comprises solely a resistive device.

8. The buffer circuit according to claim 7 wherein the differential pair output switch comprises a common emitter differential pair having a common emitter node.

9. The buffer circuit according to claim 7 wherein the resistive device comprises an active resistor.

* * * * *